United States Patent
Owen et al.

(10) Patent No.: US 6,927,835 B2
(45) Date of Patent: Aug. 9, 2005

(54) ADAPTIVE THERMAL CONTROL OF LITHOGRAPHIC CHEMICAL PROCESSES

(75) Inventors: Cassandra M Owen, Chandler, AZ (US); Wim T Tel, Helmond (NL); Stephan Ewald Sinkwitz, Solingen (DE)

(73) Assignee: ASML Netherlands B.V. (NL)

( * ) Notice: Subject to any disclaimer, the term of this patent is extended or adjusted under 35 U.S.C. 154(b) by 0 days.

(21) Appl. No.: 10/660,646

(22) Filed: Sep. 12, 2003

(65) Prior Publication Data

US 2005/0057733 A1 Mar. 17, 2005

(51) Int. Cl.⁷ .......................... G03B 27/32; G03B 27/52
(52) U.S. Cl. .......................................... 355/27; 355/30
(58) Field of Search .............................. 355/27, 30, 55, 355/77

(56) References Cited

U.S. PATENT DOCUMENTS 6,377,334 B2 * 4/2002 Whiting ........................ 355/55

\* cited by examiner

Primary Examiner—Rodney Fuller
(74) Attorney, Agent, or Firm—Blakely Sokoloff Taylor & Zafman

(57) ABSTRACT

A system, apparatus, and method for thermally controlling lithographic chemical processes is disclosed herein. The thermal control system includes a multi-zone thermal sensing unit containing a plurality of thermal sensor elements. These thermal elements are configured to detect the temperature of a plurality of pre-defined zones on the substrates. The system also includes a multi-zone thermal adjustment unit that contains a plurality of thermal coupler elements, which are configured to adjust the temperature of the pre-defined zones. The system further includes a thermal controller unit, operatively and communicatively coupled to the multi-zone thermal sensing unit and the multi-zone thermal adjustment unit. The thermal controller unit receives the detected temperature from the multi-zone thermal sensing unit, processes the detected temperature information, generates temperature control information based on the processed temperature information, and communicates the temperature control information to the multi-zone thermal adjustment unit to adjust the temperatures of the pre-defined zones.

22 Claims, 4 Drawing Sheets

ADAPTIVE THERMAL CONTROL OF LITHOGRAPHIC CHEMICAL PROCESSES

BACKGROUND OF THE INVENTION

1. Field of the Invention

The present invention generally relates to lithographic systems and apparatuses and lithographic exposure processes.

2. Description of the Related Art

The term "patterning means" as will be employed herein should be broadly interpreted to refer to means that can be used to endow an incoming radiation beam with a patterned cross-section, corresponding to a pattern that is to be created in a target portion of the substrate. The term "light valve" may also be used in this context. Generally, the pattern will correspond to a particular functional layer in a device being created in the target portion, such as an integrated circuit or other device (see below). Examples of such patterning means include:

(a) a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

(b) a programmable mirror array: an example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and (c) a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as set forth above. Also, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Lithographic exposure apparatuses can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time.

In current apparatuses, employing patterning by a mask on a mask table, a distinction can be made between two different types of machine. In one type of lithographic exposure apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Because, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

It is to be noted that the lithographic apparatus may also be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In manufacturing processes employing lithographic exposure apparatuses a pattern (e.g. in a mask or reticle) is imaged or exposed onto a substrate wafer that is at least partially covered by a layer of radiation-sensitive material (resist). Prior to this exposure step, the substrate wafer may undergo various processes, such as priming, resist coating, and a soft bake.

After exposure, the substrate may be subjected to additional processes, such as a post-exposure bake (PEB), chilling, development, a hard bake and measurement/inspection of the imaged features. These post-exposure processes are used as a basis to pattern an individual layer of a device, e.g. an IC. Such a patterned layer may then undergo further post-exposure processes such as etching, ion-implantation (doping), metallization, oxidation, chemo-mechanical polishing, etc., all intended to finish off an individual layer. If several layers are required, then the entire procedure, or a variant thereof, will have to be repeated for each new layer.

Eventually, an array of devices will be present on the substrate (wafer) and these devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

Needless to say, it is important that the features and profile of the pattern exposed on the target fields of the wafer substrate are replicated as accurately as possible. To this end, manufacturers normally specify the critical dimension (CD) of the exposed pattern in order to characterize the features and profile of the pattern and establish a benchmark level of quality and uniformity. Another important consideration is the ability to manipulate the lithographic fabrication process to repeatedly and increasingly yield high-quality substrate wafers.

There are, however, numerous activities during the lithographic fabrication process that affect the critical dimension uniformity (CDU) and compromise the quality of the exposed patterns. Indeed, the very pre- and post-exposure processes that service and treat the substrate wafers may contribute to variations in the CDU. Moreover many of these pre- and post-exposure processes involve the use of chemicals that react with the substrate wafers to achieve an intended effect on the wafer. And, although these chemical reactions may follow predictable Arhenius behaviors (i.e., reaction rates are proportional to temperature), temperature gradients cannot be controlled as the reactions occur. All these factors may contribute to variations and non-uniformities in either the individual target fields, across a wafer, or between wafers—ultimately resulting in loss of productive yields.

SUMMARY OF THE INVENTION

Systems and apparatuses consistent with the principles of the present invention, as embodied and broadly described herein, provide for thermally controlling lithographic chemical processes. The thermal control system includes a multi-zone thermal sensing unit containing a plurality of thermal sensor elements. These thermal elements are configured to detect the temperature of a plurality of pre-defined zones on the substrates. The system also includes a multi-zone thermal adjustment unit that contains a plurality of thermal coupler elements, which are configured to adjust the temperature of the pre-defined zones. The system further includes a thermal controller unit, operatively and communicatively coupled to the multi-zone thermal sensing unit and the multi-zone thermal adjustment unit. The thermal controller unit receives the detected temperature from the multi-zone thermal sensing unit, processes the detected temperature information, generates temperature control information based on the processed temperature information, and communicates the temperature control information to the multi-zone thermal adjustment unit to adjust the temperatures of the pre-defined zones.

A disclosed method, consistent with the principles of the present invention, provides for thermally controlling the chemical-processing of lithographic substrates. The method includes detecting the temperatures of a plurality of pre-defined zones on the substrates through a plurality of thermal sensor elements and comparing the detected temperatures of the pre-defined zones with expected temperature of the pre-defined zones via a thermal controller unit. The method additionally includes generating temperature control information by the thermal control unit to adjust the detected temperature of the pre-defined zones in response to determining that the comparisons exceed a pre-specified threshold value and adjusting the detected temperature of the predefined zones through a plurality of thermal coupler elements in response to the temperature control information generated by said thermal controller unit.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the figures, corresponding reference symbols indicate corresponding parts.

DETAILED DESCRIPTION

As noted above, processes that treat the substrate wafers may contribute to variations in CDU that negatively affect the quality and performance of the exposed patterns on the substrate. Such non-uniformities may occur across a target field, across a wafer, and between wafers. Moreover, these non-uniformities depend on a variety of factors, including the rate of chemical reactions on the substrate. As described in greater detail below, the present invention contemplates a lithographic system with an adaptive thermal control feature that can regulate the temperature of various chemical processes, thereby controlling and increasing reaction rates, resulting in improved CDUs and high-quality yields. This thermal control feature employs a multi-zone thermal sensor unit and a multi-zone thermal adjustment unit that cooperate to adaptively regulate the temperature of a chemical reaction within a predefined zone during pre- and/or post-exposure processes.

Figure 1:
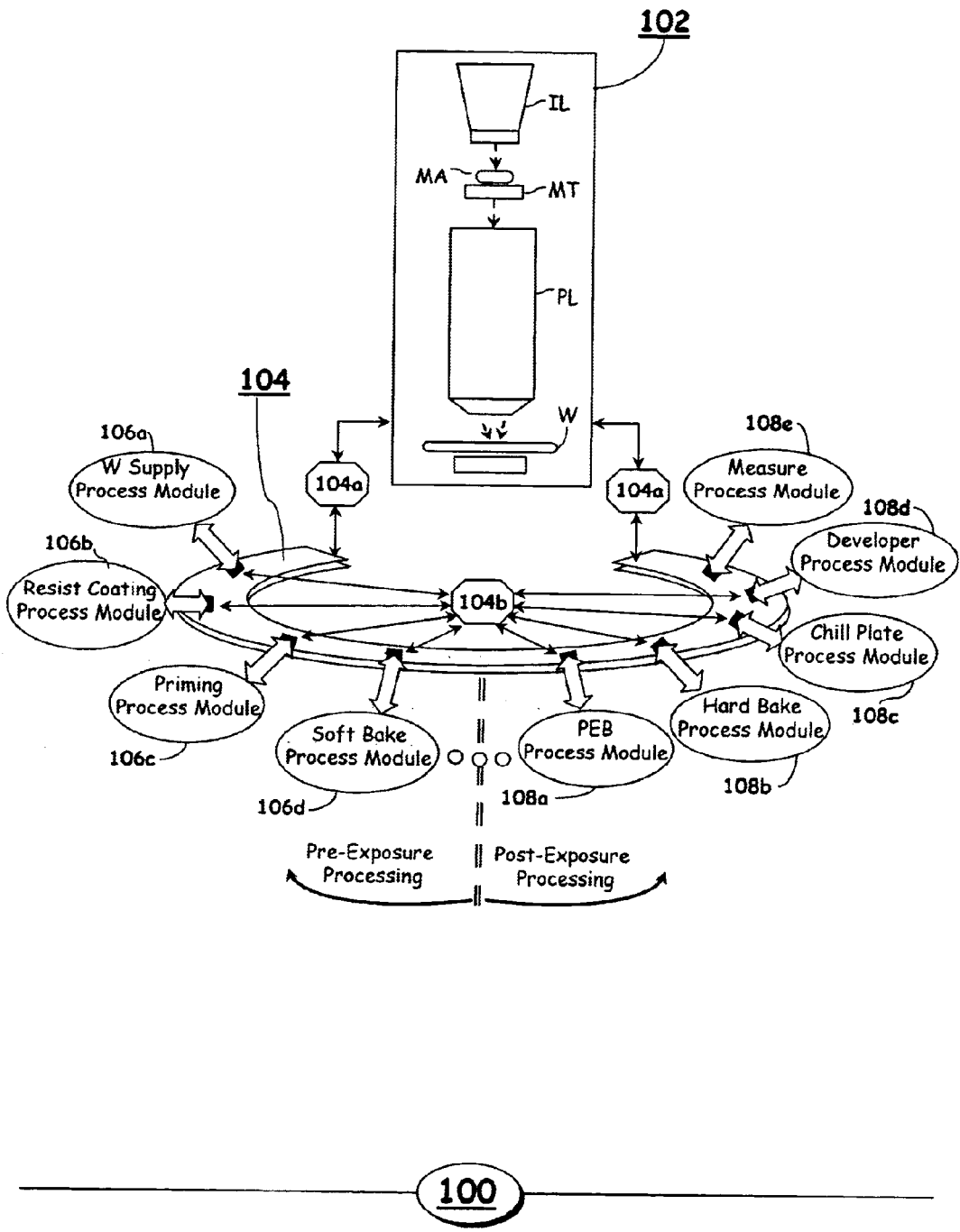
FIG. 1 is a schematic illustration of a photolithographic exposure apparatus and wafer track apparatus.

FIG. 1 schematically depicts lithographic system 100 according to a particular embodiment of the invention. System 100 comprises lithographic exposure apparatus 102, which is configured to expose a pattern onto a substrate wafer, and wafer track apparatus 104, which is configured to transport the substrate wafers between the various pre- and post-exposure processing modules.

Figure 2:
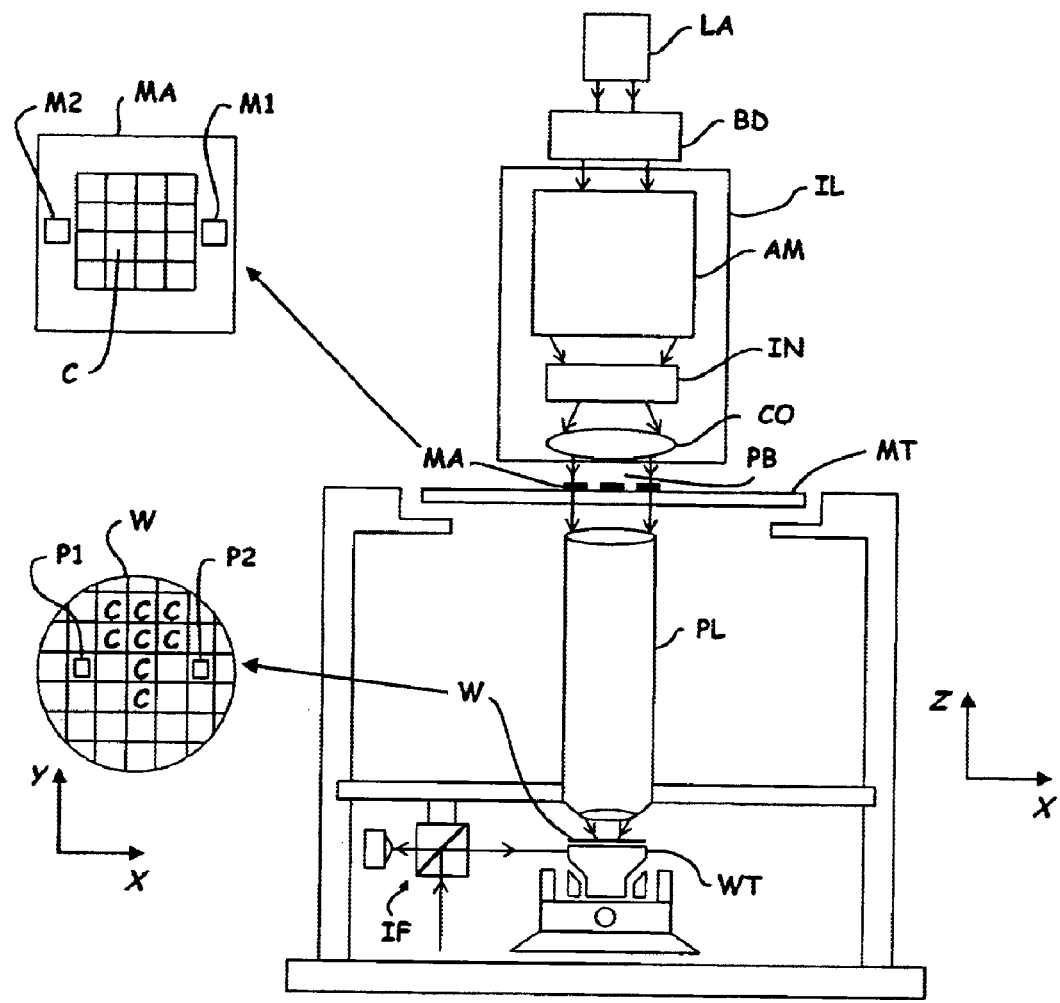
FIG. 2 is a schematic illustration of a photolithographic exposure apparatus.

FIG. 2 provides a more detailed illustration of lithographic apparatus 102. As indicated in FIG. 2, lithographic apparatus 102 includes radiation source LA and radiation system IL for providing a projection beam PB, a first object table (e.g. mask table) MT provided with a mask holder for holding a mask MA (e.g. a reticle), and a projection system PL (e.g., lens) for imaging an irradiated portion of the mask MA onto a target portion C (e.g. comprising one or more dies) of the substrate W. As depicted, lithographic apparatus 102 is of a transmissive type (i.e. has a transmissive mask). However, in general, it may also be of a reflective type, for example (with a reflective mask) and, alternatively, apparatus 102 may employ another kind of patterning means, such as a programmable mirror array of a type as indicated above.

Lithographic apparatus 102 further comprises a second object table (e.g., substrate table) WT provided with a substrate holder for holding a substrate W (e.g. a resist-coated silicon wafer).

Source LA produces a beam of radiation, which is fed into illumination system (e.g., illuminator) IL, either directly or after having traversed conditioning means, such as a beam expander Ex, for example. Illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired cross-sectional uniformity and intensity distribution.

It is to be noted with regard to FIG. 2, that source LA may be within the housing of lithographic exposure apparatus 102 (as is often the case when the source LA is a mercury lamp, for example). However, it may also be remote from apparatus 102, as in the case of an excimer laser source. In this scenario, the remote radiation beam is guided into apparatus 102 by virtue of suitable directing mirrors. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately (e.g. so as to position different target portions C in the path of the beam PH). Similarly, the first positioning means can be used to accurately position the mask MA with respect to the path of the beam PB (e.g. after mechanical retrieval of the mask MA from a mask library, or during a scan).

In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus), the mask table MT may just be connected to a short stroke actuator, or may be fixed.

Lithographic apparatus 102 can be used in two different modes:
  (a) step mode: mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and
  (b) scan mode: essentially the same scenario applies, except that a given target portion C is not exposed in a single "flash". Instead, mask table MT is movable in a given direction (the so-called "scan direction", e.g. the y direction) with a speed v, so that projection beam PB is caused to scan over a mask image. Concurrently, substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Returning to FIG. 1, the wafer track apparatus 104 portion of lithographic system 100 interconnects lithographic exposure apparatus 102 with a host of pre-exposure processing modules, which are configured to treat the substrate wafers prior to exposure. These pre-processing modules may include, for example, wafer supply module 106a, resist coating module 106b, priming module 106c, and soft bake module 106d. Additionally, wafer supply module 1 06a may include a loading station 12 for loading and unloading cassettes containing wafers to be processed.

Similarly, wafer track apparatus 104 interconnects lithographic exposure apparatus 102 with a variety of post-exposure processing modules, which are configured to treat and service the substrate wafers after exposure. These post-exposure processing modules may include, for example, post-exposure bake (PEB) module 108a, hard bake module 108b, chill plate module 108c, developer module 108d, and measurement module 108e.

With respect to measurement process module 108e, it is to be noted that such a module may be used to calibrate metrology information. For example, process module 108e may be configured to measure and assess a host of wafer substrate attributes and artifacts that relate to CDU, such as the CD of the entire substrate, the CD of the individual target fields, and various profile dimensions. To this end, measurement process module 108e may comprise a scanning electron microscope (SEM), electrical line measurement (ELM) devices, or similar devices suitable for such measurement purposes.

Wafer track apparatus 104 may include an interface section 104a configured to direct the transport of wafer substrates W to and from lithographic exposure apparatus 102. Wafer track apparatus 104 may also include a second interface section 104b configured to direct the transport of wafer substrates W between the various processing modules. As such, the wafer substrates W are delivered to, processed by, removed from, and transported between the processing modules by wafer track apparatus 104.

Figure 3A:
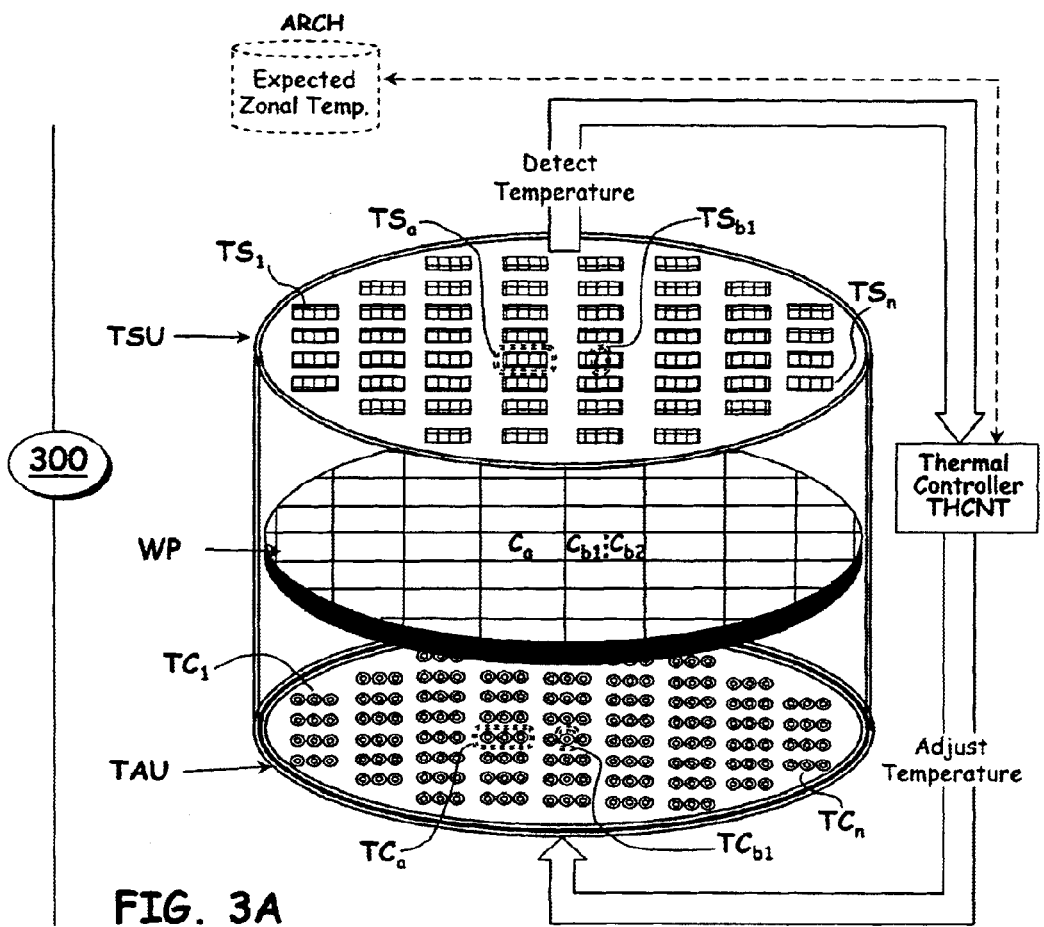
FIG. 3A is a schematic functional block diagram depicting an embodiment of the present invention.

FIG. 3A is a schematic functional block diagram depicting adaptive thermal control (ATC) system 300, constructed and operative in accordance with a particular embodiment of the present invention. As noted above, many of the pre- and post-exposure process modules treat the wafer substrates W by applying or treating the substrates W with certain chemicals that react with the substrates W to achieve a desired effect. ATC system 300 is configured to control the temperature of the reaction during the chemical treatment process in order to control the reaction rate, thereby improving CDU and increasing productive yields.

As indicated in FIG. 3A, ATC system 300 comprises a multi-zone thermal sensor unit TSU operatively and communicatively coupled to a thermal controller THCNT. Thermal sensor unit TSU is configured to detect zonal temperatures and supply the detected temperatures to thermal controller THCNT. Thermal controller THCNT is also operatively and communicatively coupled to a multi-zone thermal adjustment unit TAU. As such, thermal controller THCNT generates temperature control information that adjusts the temperature of particular zones within the thermal adjustment unit TAU, in response to the detected zonal temperatures supplied by thermal sensor unit TSU.

As depicted in FIG. 3A, multi-zone thermal sensor unit TSU may comprise a plurality of thermal sensor elements $TS_1$–$TS_n$, each sensor element being configured to detect temperatures for a particular zone of the wafer substrate workpiece WP being treated and processed. In the illustrated embodiment, thermal sensors $TS_1$–$TS_n$ are arranged on a plane suspended above the wafer substrate workpiece WP. The distance between the plane of thermal sensor elements $TS_1$–$TS_n$ and the workpiece WP should be configured so as to provide accurate temperature readings.

Moreover, the zones in which the thermal sensor elements $TS_1$–$TS_n$ are configured to detect temperatures may be for a plurality of target portions or dies on the workpiece WP, for individual dies, or for portion of an individual die. For example, as indicated in FIG. 3A, the zonal resolution for thermal sensor $TS_a$ covers entire die $C_a$ while the resolution for thermal sensor $TS_{b1}$ covers a subset of die $C_b$, i.e., $C_{b1}$.

Multi-zone thermal adjustment unit TSA of ATC 300 may comprise a plurality of thermal coupler elements $TC_1$–$TC_n$, each coupler element being configured to adjust the temperature for a particular zone of the wafer substrate workpiece WP being treated and processed. In the illustrated embodiment, thermal couplers $TC_1$–$TC_n$ are arranged on a plane below the wafer substrate workpiece WP. The distance between the plane of thermal sensor elements $TC_1$–$TC_n$ and the workpiece WP should be configured so as to provide accurate and timely temperature regulation.

Much like their thermal sensing counterparts, the zones in which the thermal coupler elements $TC_1$–$TC_n$ are configured to adjust temperatures may be for a plurality of target portions or dies on the workpiece WP, for individual dies, or for portion of an individual die. For example, as indicated in FIG. 3A, the zonal resolution for thermal couplers $TC_a$ covers entire die $C_a$ while the resolution for thermal sensor $TC_{b1}$ covers a die portion $C_{b1}$.

As briefly stated above, thermal controller THCNT of ATC system 300 is configured to communicate with thermal sensor unit TSU and thermal adjustment unit TAU, to receive zonal temperatures detected by thermal sensor unit TSU, and to generate temperature control information that adjusts the temperature of particular zones within the thermal adjustment unit TAU. Communication between thermal controller THCNT and thermal sensor unit TSU and thermal adjustment unit TAU may be achieved in a variety of ways known in the art, such as, for example, infra-red, wireless, and/or hard-wired communication links.

Moreover, thermal controller THCNT may comprise micro-processing circuitry, application-specific integrated circuitry (ASIC), or similar logic circuitry capable of processing information and instructions, responding to information requests, communicating with linked devices, and executing commands. In addition, thermal controller THCNT may include electronic memory and/or storage and may also interface and communicate with external electronic memory and storage devices. To this end, thermal controller THCNT may communicate with, access information from, or furnish updating information to, a data repository, such as, a database or archived list of expected zonal temperatures, in order to improve thermal control processing.

Figure 3B:
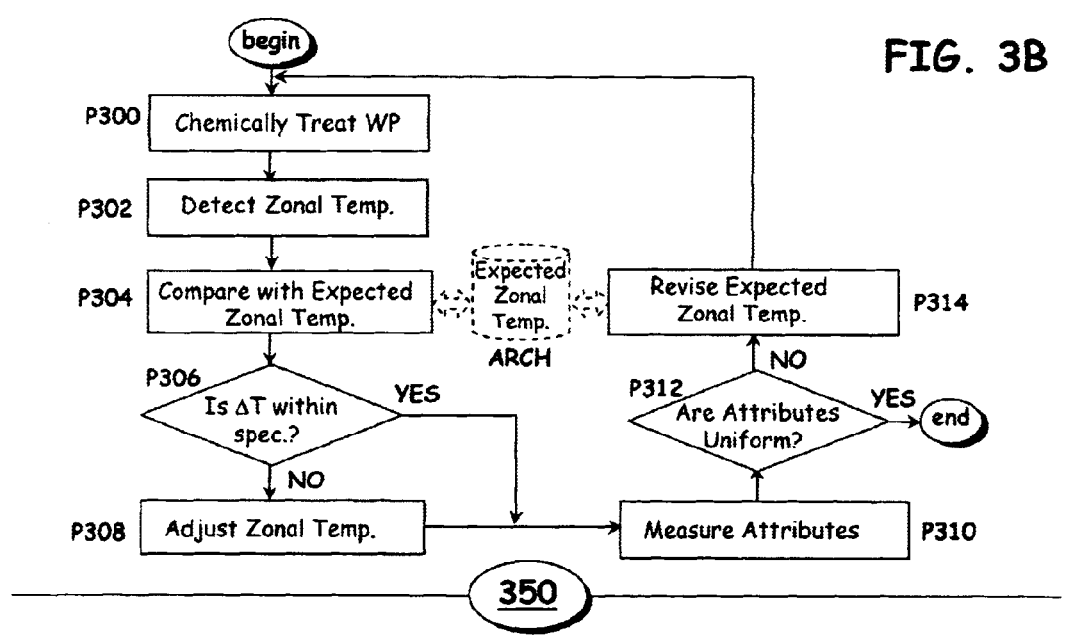
FIG. 3B is a high level flow diagram depicting an embodiment of the present invention.

FIG. 3B depicts adaptive thermal control (ATC) process 350, constructed and operative in accordance with a particular embodiment of the present invention. A TC process 350 is designed to control the temperature of the reaction during lithographic processes that involve chemical treatments and reactions in order to control the reaction rate, thereby improving CDU and increasing productive yields. As indicated in FIG. 3B, ATC process 350 commences with procedure task P300 in which the wafer substrate workpiece WP is chemically treated.

After chemically treating workpiece WP, ATC process 350 advances to procedure task P302, in which multi-zone thermal sensor unit TSU detects the temperature of the plurality of zones on the chemically-treated workpiece WP via thermal sensor elements $TS_1$–$TS_n$. As noted above, the array of zonal temperature information is supplied to thermal controller THCNT.

In procedure task P304, thermal controller THCNT compares the supplied zonal temperature information with expected zonal temperature information. The expected zonal temperatures may be based on theoretical information, predictive models, empirical information, or other similar information. As indicated in FIG. 3B, the expected zonal temperature information may be stored in a database, library, or archived list ARCH. Thermal controller THCNT then determines the difference $\Delta T$ between the detected temperature for a particular zone or zones and the expected temperature for that zone or zones.

In procedure task P306, thermal controller THCNT determines whether the difference $\Delta T$ between the detected temperature and the expected temperature is within a pre-specified threshold for the particular zone or zones. If not, thermal controller THCNT generates control information to adjust the temperature of thermal coupler elements $TC_1$–$TC_n$ on thermal adjustment unit TAU that correspond to the particular zone or zones on the workpiece WP. This, in turn, adjusts the temperature of the chemical reaction occurring on the workpiece WP zone. The temperature adjustment includes either increasing or decreasing the temperature of thermal coupler elements $TC_1$–$TC_n$ to optimize the rate of reaction occurring on the workpiece WP.

If thermal controller THCNT determines that the difference $\Delta T$ between the detected temperature and the expected temperature for all zones is within the pre-specified threshold, then ATC process 350 progresses to procedure task P310, where the attributes for the individual dies, sets of dies, and/or the workpiece are measured. As noted above, this task may be performed by measurement process module 108e, which is configured to measure and assess a host of wafer substrate attributes and artifacts that relate to CDU, such as the CD of the entire substrate, the CD of the individual target fields, and various profile dimensions.

After measuring, ATC process 350 progresses to procedure task P312, where it determines whether the measured attributes are sufficiently uniform and, if so, ATC process 350 terminates. If not, ATC process 350 reaches procedure task P314 where it revises and updates the expected zonal temperatures for the particular zone or zones based on the measured attributes and then returns to procedure task P300 for subsequent workpieces. The expected zonal temperatures are revised in an effort to converge on the optimum zonal temperatures that yield the desired CDU.

In this manner, ATC process 350 adaptively controls the temperature and rate of reaction during chemical treatment processes, thereby improving CDU and increasing productive yields.

Figure 4:
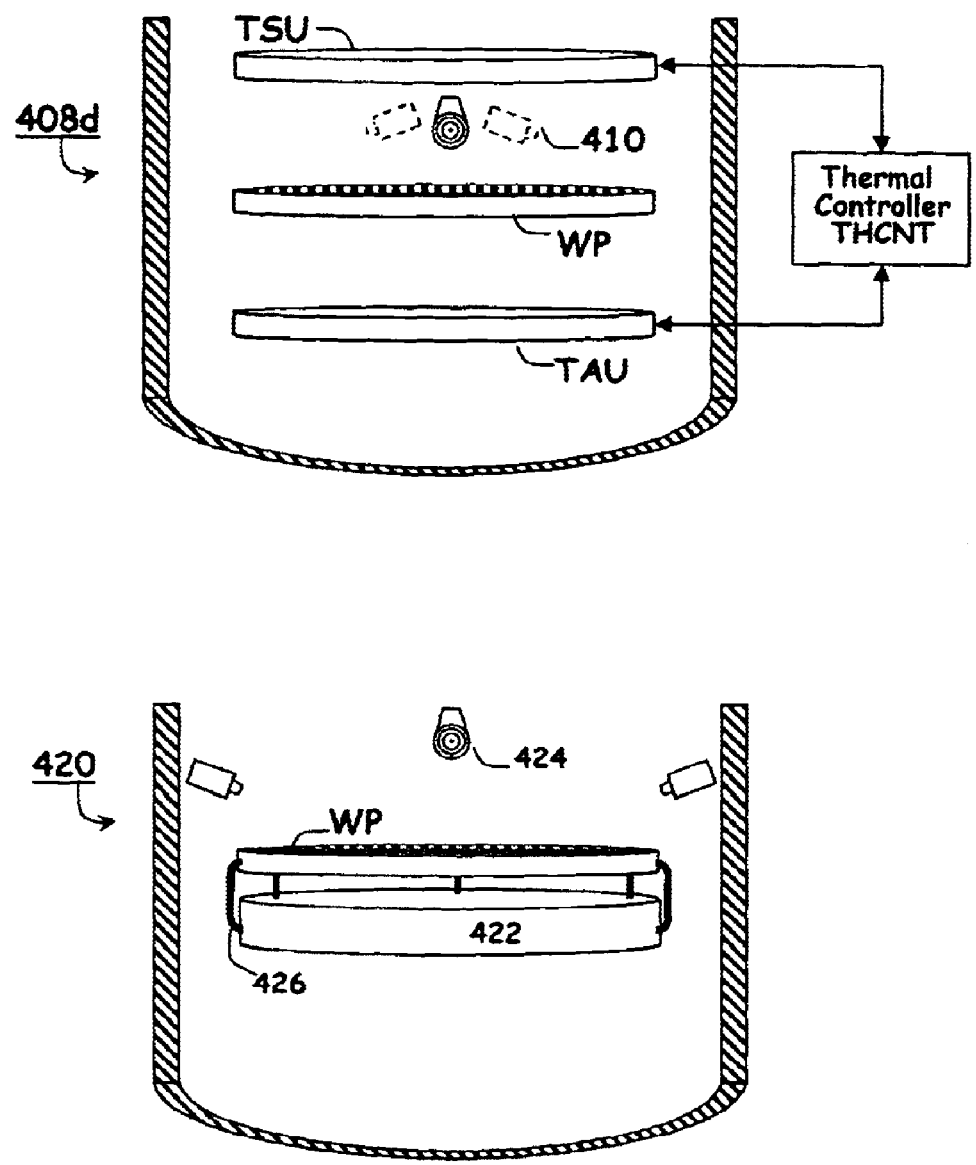
FIG. 4 schematic functional block diagram depicting another embodiment of the present invention related to a developer processing module.

By way of example, consider the processing module implementation as illustrated in FIG. 4, constructed and operative in accordance with a particular embodiment of the present invention. FIG. 4 depicts developer processing module 408d employing features of the invention described above. Although these features are discussed in reference to developer processing, it will be appreciated that such features, or variants thereof, may apply equally to other chemically-related lithographic processes.

Generally, a developer process module incorporates both the developer application process and the spinning process to dissolve areas on the substrate W where the chemical composition of the photo-activated resist material has changed due to exposure. In particular the developer solution is applied to the wafer substrate W to remove the chemically changed resist material and, after a predetermined interval, the substrate W is spun to rinse away the remnants. By implementing features of the present invention, however, developer processing may be optimized to improve CDU and increasing productive yields.

As depicted in FIG. 4, developer processing module 408d includes a scanning nozzle or a plurality of stationary nozzles 410 that apply a uniform film of developer solution on the wafer substrate workpiece WP. Module 408d also includes multi-zone thermal sensor unit TSU and multi-zone thermal adjustment unit TAU, both operatively and communicatively coupled to thermal controller THCNT. After the developer solution has been uniformly distributed on workpiece WP, thermal sensor unit TSU, thermal adjustment unit TAU, and thermal controller THCNT cooperate, as discussed above, to maintain desired temperatures across the various zones on workpiece WP. That is, based on the zonal temperatures detected by thermal sensor unit TSU, thermal controller THCNT generates temperature control information that adjusts the temperature of particular zones within the thermal adjustment unit TAU to ensure desired temperatures on the workpiece WP.

By controlling the temperature on the workpiece WP, developer processing module 408d may be relieved of the spinning process. Along these lines, a communal rinse and spin module 420 may be configured to be dedicated to rinsing developer and other chemical solutions while being shared by other processing modules to improve throughput. Such a module may employ a scanning nozzle or a plurality of stationary nozzles 424 to distribute water or other cleaning solutions, a spinning plate 422 to rotate and rinse away any remnants, and a holding device 426 to keep the workpiece WP coupled to spinning plate 422.

The following detailed description refers to the accompanying drawings that illustrate exemplary embodiments consistent with the present invention. Other embodiments are possible and modifications may be made to the embodiments without departing from the spirit and scope of the invention. For example, the embodiments described below may, instead, be implemented in different embodiments of software, firmware, and hardware in the entities illustrated in the figures. As such, the operation and behavior of the present invention will be described with the understanding that modifications and variations of the embodiments are possible, given the level of detail present herein. Thus, the following detailed description is not meant or intended to limit the invention—rather the scope of the invention is defined by the appended claims.

What is claimed is:

1. A thermal control system for chemically-processing lithographic substrates, comprising:

a measurement processing module to measure metrological attributes of said substrates and generate substrate metrological attribute information;

a multi-zone thermal sensing unit containing a plurality of thermal sensor elements that detect the temperature of a plurality of pre-defined zones on said substrates;

a multi-zone thermal adjustment unit containing a plurality of thermal coupler elements that adjusts the temperature of said pre-defined zones; and a thermal controller unit operatively and communicatively coupled to said measurement processing module, said multi-zone thermal sensing unit, and said multi-zone thermal adjustment unit, said thermal controller unit containing logic circuitry to receive information from said measurement processing module, said multi-zone thermal sensing unit, and said multi-zone thermal adjustment unit, to process information, and to supply information to said multi-zone thermal sensing unit and said multi-zone thermal adjustment unit, wherein said multi-zone thermal sensing unit communicates detected temperature information to said thermal controller unit, and wherein said thermal controller unit processes said detected temperature information, generates temperature control information based on said processed temperature information, and communicates said temperature control information to said multi-zone thermal adjustment unit to adjust the temperatures of said pre-defined zones.

2. The thermal control system of claim 1, further including an electronic storage device containing expected temperature information for said pre-defined zones.

3. The thermal control system of claim 2, wherein said thermal controller unit processes said detected temperature information by including comparisons between said detected temperature information and said expected temperature information stored in said electronic storage device.

4. The thermal control system of claim 3, wherein said thermal controller unit generates said temperature control information to adjust the temperatures of said pre-defined zones by determining whether said comparisons between said detected temperature information and said expected temperature information exceed a pre-specified threshold value.

5. The thermal control system of claim 4, wherein said metrological attributes are related to the critical dimension uniformity of said substrate.

6. The thermal control system of claim 5, further including revising said expected temperature information for said pre-defined zones based on said substrate metrological attribute information.

7. The thermal control system of claim 1, further including an electronic storage device containing expected temperature information for said pre-defined zones, wherein said thermal controller unit, processes said detected temperature information by comparing said detected temperature information and said expected temperature information stored in said electronic storage device, and generates said temperature control information by determining whether said comparisons between said detected temperature information and said expected temperature information exceed a pre-specified threshold value.

8. The thermal control system of claim 6, wherein said metrological attributes include at least one of the critical dimension of said entire substrate, the critical dimension of a target field on said substrate, and profile dimensions of said substrate.

9. A method of thermally controlling the chemical processing of lithographic substrates, comprising:

measuring metrological attributes of said substrates;

generating substrate metrological attribute information based on said measured attributes;

detecting the temperatures of a plurality of pre-defined zones on said substrates through a plurality of thermal sensor elements;

comparing said detected temperatures of said pre-defined zones with expected temperature of said pre-defined zones via a thermal controller unit; and generating temperature control information by said thermal control unit to adjust said detected temperature of said pre-defined zones in response to determining that said comparisons exceed a pre-specified threshold value; and adjusting said detected temperature of said pre-defined zones through a plurality of thermal coupler elements in response to said temperature control information generated by said thermal controller unit.

10. The thermal control method of claim 9, further including electronically storing expected temperature information for said pre-defined zones.

11. The thermal control method of claim 9 further including, measuring metrological attributes of said substrates; and generating substrate metrological attribute information based on said measured attributes wherein said metrological attributes include at least one of the critical dimension of said entire substrate, the critical dimension of a target field on said substrate, and profile dimensions of said substrate.

12. The thermal control method of claim 11, further including revising said expected temperature information for said pre-defined zones based on said substrate metrological attribute information.

13. A lithographic system comprising:

a lithographic apparatus including,
an illuminator to provide a projection beam of radiation,
a support to hold a patterning device, the patterning device configured to pattern the projection beam according to a desired pattern,
a substrate table configured to hold a substrate, and
a projection system to expose the patterned beam onto a target portion of the substrate, and a wafer track apparatus including,
a measurement processing module to measure metrological attributes of said substrate and generate substrate metrological attribute information,
at least one processing module configured to chemically process said substrate, and
a thermal control system to control the temperature during the chemical processing of said substrate, wherein said thermal control system comprises,
a multi-zone thermal sensing unit containing a plurality of thermal sensor elements that detect the temperature of a plurality of pre-defined zones on said substrate,
a multi-zone thermal adjustment unit containing a plurality of thermal coupler elements that adjusts the temperature of said pre-defined zones, and
a thermal controller unit operatively and communicatively coupled to said multi-zone thermal sensing unit and said multi-zone thermal adjustment unit, said thermal controller unit containing logic circuitry to receive information from said multi-zone thermal sensing unit and said multi-zone thermal adjustment unit, to process information, and to supply information to said multi-zone thermal sensing unit and said multi-zone thermal adjustment unit, wherein said multi-zone thermal sensing unit communicates detected temperature information to said thermal controller unit, and wherein said thermal controller unit processes said detected temperature information, generates temperature control information based on said processed temperature information, and communicates said temperature control information to said multi-zone thermal adjustment unit to adjust the temperatures of said pre-defined zones.

14. The lithographic system of claim 13, further including an electronic storage device containing expected temperature information for said pre-defined zones, wherein said thermal controller unit, processes said detected temperature information by comparing said detected temperature information and said expected temperature information stored in said electronic storage device, and generates said temperature control information by determining whether said comparisons between said detected temperature information and said expected temperature information exceed a pre-specified threshold value.

15. The lithographic system of claim 14, wherein said expected temperature information for said pre-defined zones is revised based on said substrate attribute information.

16. The lithographic system of claim 14, wherein said at least one processing module is configured as a developer module to develop said wafer, said developer module including an application nozzle to uniformly distribute a solution.

17. The lithographic system of claim 16, wherein said wafer track apparatus further includes a rinse module dedicated to rinsing said developed substrate, said rinse module including a cleaning nozzle to distribute a cleaning solution, a spinning plate that receives said developed substrate, and a holding device to firmly attach said developed substrate to said spinning plate.

18. A wafer track apparatus comprising:

a measurement processing module to measure metrological attributes of a substrate and generate substrate metrological attribute information, at least one processing module configured to chemically process said substrate, and a thermal control system to control the temperature during the chemical processing of said substrate, wherein said thermal control system comprises, a multi-zone thermal sensing unit containing a plurality of thermal sensor elements that detect the temperature of a plurality of pre-defined zones on said substrate, a multi-zone thermal adjustment unit containing a plurality of thermal coupler elements that adjusts the temperature of said pre-defined zones, and a thermal controller unit operatively and communicatively coupled to said multi-zone thermal sensing unit and said multi-zone thermal adjustment unit, said thermal controller unit containing logic circuitry to receive information from said multi-zone thermal sensing unit and said multi-zone thermal adjustment unit, to process information, and to supply information to said multi-zone thermal sensing unit and said multi-zone thermal adjustment unit, wherein said multi-zone thermal sensing unit communicates detected temperature information to said thermal controller unit, and wherein said thermal controller unit processes said detected temperature information, generates temperature control information based on said processed temperature information, and communicates said temperature control information to said multi-zone thermal adjustment unit to adjust the temperatures of said pre-defined zones.

19. The wafer track apparatus of claim 18, further including an electronic storage device containing expected temperature information for said pre-defined zones, wherein said thermal controller unit, processes said detected temperature information by comparing said detected temperature information and said expected temperature information stored in said electronic storage device, and generates said temperature control information by determining whether said comparisons between said detected temperature information and said expected temperature information exceed a pre-specified threshold value.

20. The wafer track apparatus of claim 19, wherein said expected temperature information for said pre-defined zones is revised based on said substrate attribute information.

21. The wafer track apparatus of claim 19, wherein said at least one processing module is configured as a developer module to develop said wafer, said developer module including an application nozzle to uniformly distribute a solution.

22. The wafer track apparatus of claim 21, wherein said wafer track apparatus further includes a rinse module dedicated to rinsing said developed substrate, said rinse module including a cleaning nozzle to distribute a cleaning solution, a spinning plate that receives said developed substrate, and a holding device to firmly attach said developed substrate to said spinning plate.

* * * * *